US012002800B2

(12) United States Patent
Huang

(10) Patent No.: US 12,002,800 B2
(45) Date of Patent: Jun. 4, 2024

(54) PROTECTION CIRCUIT

(71) Applicant: TAIWAN SEMICONDUCTOR MANUFACTURING CO., LTD., Hsinchu (TW)

(72) Inventor: Chien-Yao Huang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/861,544

(22) Filed: Jul. 11, 2022

(65) Prior Publication Data

US 2022/0344322 A1 Oct. 27, 2022

Related U.S. Application Data

(63) Continuation of application No. 16/886,586, filed on May 28, 2020, now Pat. No. 11,404,406, which is a
(Continued)

(51) Int. Cl.
| | |
|---|---|
| *H01L 27/02* | (2006.01) |
| *H01L 27/06* | (2006.01) |
| *H01L 27/092* | (2006.01) |
| *H01L 29/06* | (2006.01) |
| *H01L 29/08* | (2006.01) |
| *H01L 29/735* | (2006.01) |

(52) U.S. Cl.
CPC ........ *H01L 27/0248* (2013.01); *H01L 27/027* (2013.01); *H01L 27/0629* (2013.01); *H01L 27/067* (2013.01); *H01L 27/0921* (2013.01); *H01L 29/0619* (2013.01); *H01L 29/0808* (2013.01); *H01L 29/0821* (2013.01); *H01L 29/735* (2013.01)

(58) Field of Classification Search
CPC .... H01L 27/0248; H01L 27/027; H02H 9/046
See application file for complete search history.

(56) References Cited

U.S. PATENT DOCUMENTS

| | | | |
|---|---|---|---|
| 3,725,683 | A | 4/1973 | Andersen |
| 3,913,125 | A | 10/1975 | Geller et al. |
| | | (Continued) | |

FOREIGN PATENT DOCUMENTS

| | | | |
|---|---|---|---|
| CN | 1959988 A | | 5/2007 |
| CN | 101728393 A | | 6/2010 |
| | (Continued) | | |

*Primary Examiner* — Scott Bauer
(74) *Attorney, Agent, or Firm* — Maschoff Brennan

(57) ABSTRACT

A semiconductor device includes first to fifth regions, first and second resistive loads. The first region is coupled to a first reference voltage terminal. The first to third regions operate as a first transistor. The fourth region is coupled to a second reference voltage terminal. The fourth to fifth regions operate as a second transistor. The first resistive load couples the second region to the second reference voltage terminal. The second resistive load couples the fifth region to the first reference voltage terminal. The first, third, second, fifth and fourth regions are arranged in order, each of the first, second and third regions corresponds to a first conductive type, and each of the fourth and fifth regions corresponds to a second conductive type.

20 Claims, 9 Drawing Sheets

Related U.S. Application Data continuation of application No. 15/725,246, filed on Oct. 4, 2017, now Pat. No. 10,679,981.

(60) Provisional application No. 62/479,234, filed on Mar. 30, 2017.

(56) References Cited

U.S. PATENT DOCUMENTS

| | | | |
|---|---|---|---|
| 4,071,778 A | 1/1978 | Nakagomi | |
| 4,684,877 A | 8/1987 | Shreve et al. | |
| 4,821,096 A | 4/1989 | Maloney | |
| 5,747,834 A | 5/1998 | Chen et al. | |
| 6,147,369 A | 11/2000 | Chen et al. | |
| 8,022,480 B2 | 9/2011 | Kim et al. | |
| 8,395,231 B2 | 3/2013 | Terashima | |
| 2003/0047786 A1* | 3/2003 | Lee | H01L 29/87 257/355 |
| 2004/0033645 A1* | 2/2004 | Yu | H01L 27/0262 257/E21.564 |
| 2006/0215337 A1 | 9/2006 | Wu | |
| 2006/0258067 A1* | 11/2006 | Jeon | H01L 29/87 438/154 |
| 2007/0034956 A1 | 2/2007 | Lee et al. | |
| 2007/0045656 A1* | 3/2007 | Chen | H01L 27/0262 257/107 |
| 2007/0122963 A1 | 5/2007 | Chen | |
| 2007/0176260 A1 | 8/2007 | Parekh | |
| 2008/0259511 A1* | 10/2008 | Worley | H01L 27/0266 361/56 |
| 2009/0237847 A1* | 9/2009 | Ryu | H01L 27/0262 361/56 |
| 2010/0006890 A1 | 1/2010 | Wijmeersch | |
| 2013/0328125 A1* | 12/2013 | Ho | H01L 27/0262 257/355 |
| 2014/0291765 A1* | 10/2014 | Ouyang | H01L 27/0277 257/355 |
| 2015/0091056 A1 | 4/2015 | Sorgeloos | |
| 2016/0056146 A1* | 2/2016 | Li | H01L 29/7416 257/133 |

FOREIGN PATENT DOCUMENTS

| | | |
|---|---|---|
| TW | 362273 B | 6/1999 |
| TW | 393755 B | 6/2000 |
| TW | 200707693 A | 2/2007 |

* cited by examiner

PROTECTION CIRCUIT

The present application is a continuation application of U.S. application Ser. No. 16/886,586, filed on May 28, 2020, which is a continuation application of U.S. application Ser. No. 15/725,246, filed on Oct. 4, 2017, now U.S. Pat. No. 10,679,981, issued Jun. 9, 2020, which claims priority benefit of U.S. Provisional Application Ser. No. 62/479,234, filed Mar. 30, 2017, the full disclosures of which are incorporated herein by reference.

BACKGROUND

Latch-up is a general problem associated with CMOS structure that induces an undesirable conduction mechanism. CMOS integrated circuits include parasitic P/N/P/N structures that have the latch-up problem when one of the junctions in the P/N/P/N structures is forward biased. A guard ring structure and/or a pick-up structure are applied to the CMOS integrated circuits to prevent the latch-up problem, but the guard ring structure and/or the pick-up structure consume large layout area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
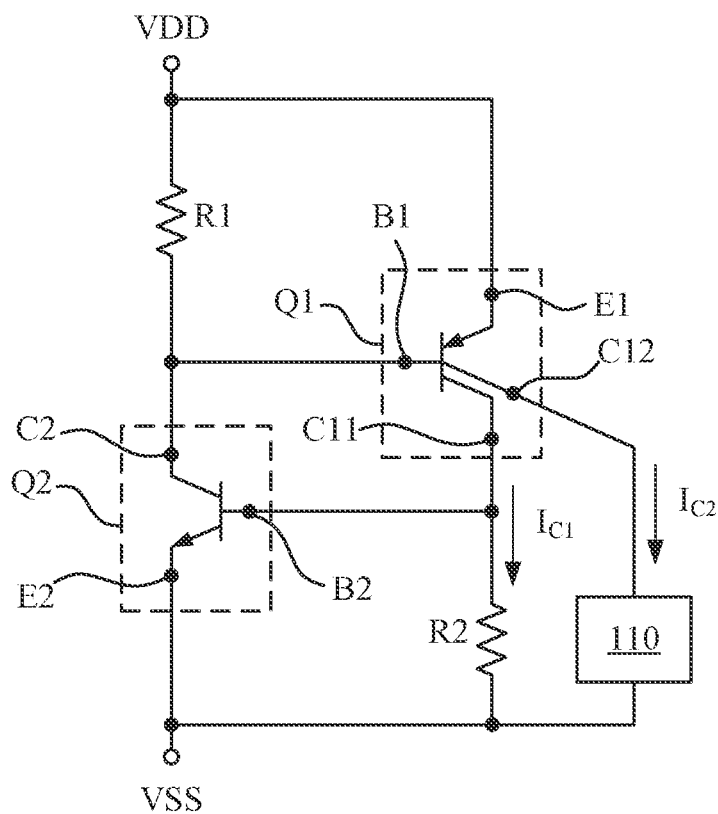
FIG. 1 is a schematic diagram of a circuit in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term mask, photolithographic mask, photomask and reticle are used to refer to the same item.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, that is, to mean including but not limited to.

Reference is made to FIG. 1. FIG. 1 is a schematic diagram of a circuit 100 in accordance with various embodiments of the present disclosure. The circuit 100 includes transistors Q1 and Q2, resistors R1 and R2, and a resistive load 110. In some embodiments, the transistor Q1 has four terminals, and the transistor Q2 has three terminals. For illustration, the transistor Q1 has a base B1 coupled to a reference voltage terminal VDD through the resistor R1, an emitter E1 coupled to the reference voltage terminal VDD, a first collector C11 coupled through the resistor R2 to a reference voltage terminal VSS, and a second collector C12 coupled to the reference voltage terminal VSS through the resistive load 110. The transistor Q2 has a base B2 coupled to the resistor R2 and the first collector C11 of the transistor Q1, an emitter E2 coupled to the reference voltage terminal VSS, and a collector C2 coupled to the base B1 of the transistor Q1 and to the reference voltage terminal VDD through the resistor R1. Explained in a different way, the transistor Q1 has two collectors C11 and C12, and the transistor Q2 has one collector C2. The transistors Q1 and Q2 are coupled together to operate as a silicon controlled rectifier (SCR).

In some embodiments, the transistor Q1 is a PNP bipolar junction transistor (BJT), and the transistor Q2 is a NPN bipolar junction transistor.

For illustration of operation with respect to the circuit 100 in FIG. 1, when a trigger source (not shown) is generated to turn on the transistor Q1, minority carriers are injected from the base-emitter (B1-E1) junction of the transistor Q1. The minority carriers are discharged through the first collector C11 of the transistor Q1 and the resistor R2 to the reference voltage terminal VSS, and also through the second collector C12 of the transistor Q1 and the resistive load 110 to the reference voltage terminal VSS. When the minority carriers are discharged through the first collector C11 and the second collector C12 of the transistor Q1, a current IC1 and a current IC2 are generated accordingly. With the current IC1 flowing through the resistor R2, a voltage at the base B2 of the transistor Q2 is generated. If the base-emitter voltage VBE of the transistor Q2 is sufficient for the transistor Q2 to turn on, the transistor Q2 will be turned on, and thus a silicon controlled rectifier (SCR) including the transistors Q1 and Q2 will be turned on.

In some approaches, minority carriers are mostly discharged through a path including, for example, the first collector C11 of the transistor Q1 as illustrated in FIG. 1. Accordingly, a parasitic SCR in integrated circuits is easily turned on in a way as discussed above. As a result, the integrated circuits including the parasitic SCR can be easily conducted in an undesired condition (also referred to as "latch-up" in some approaches), which leads to the destruction of the integrated circuits in some situations.

Compared to the above approaches, to discharge the minority carriers, a shunt path including, for illustration in FIG. 1, the second collector C12 of the transistor Q1 and the resistive load 110 is provided in the embodiments of the present application. As discussed above, the current IC2 flowing through the shunt path is also generated when the minority carriers are discharged. With the generated current IC2, the current IC1 is reduced compared to related approaches. As a result, the voltage required to turn on the transistor Q2 in FIG. 1 increases. Accordingly, a voltage for turning on the SCR which includes the transistors Q1 and Q2 increases as well, and the SCR will not be easily turned on in an undesired condition. The above voltage used for the SCR is also referred to as a holding voltage in some embodiments, which indicates a voltage sufficient for the SCR to remain turn-on. As a result, integrated circuits including the SCR will not be conducted in an undesired condition, and will be prevented from being destructed due to undesired operation. Latch-up immunity for the integrated circuits including the SCR is thus improved.

The resistive load 110 and the collectors C11 and C12 of the transistor Q1 in the circuit 100 in FIG. 1 are given for illustrative purposes. Various numbers of resistive loads and collectors of the transistor Q1 in the circuit 100 are within the contemplated scope of the present disclosure.

Figure 2:
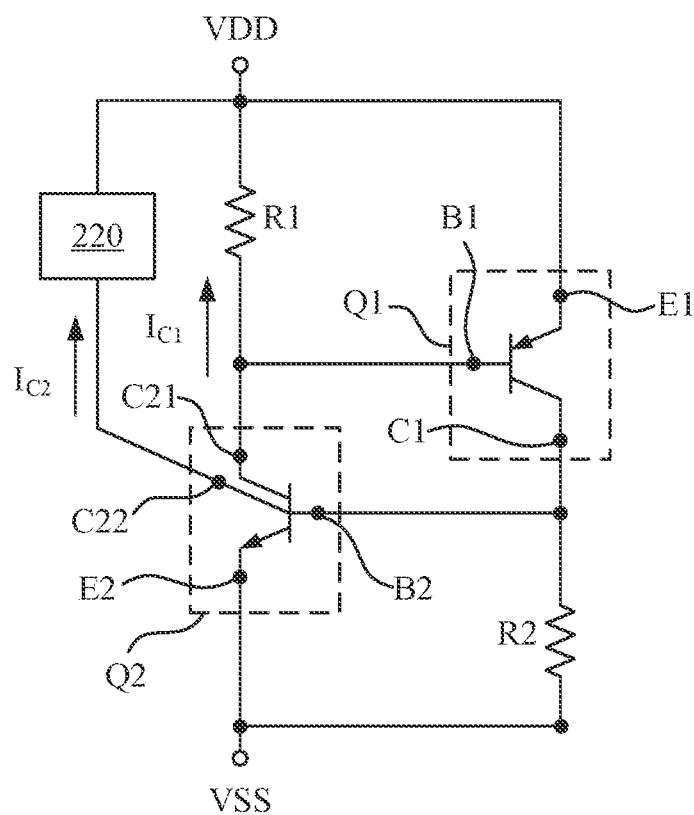
FIG. 2 is a schematic diagram of a circuit in accordance with some other embodiments of the present disclosure.

In alternative embodiments, the transistor Q2 has four terminals, and the transistor Q1 has three terminals. Reference is made to FIG. 2. FIG. 2 is a schematic diagram of a circuit 200 in accordance with various embodiments of the present disclosure. With respect to the embodiments of FIG. 2, like elements in FIG. 1 are designated with the same reference numbers for ease of understanding. The circuit 200 includes transistors Q1 and Q2, the resistors R1 and R2, and a resistive load 220. For illustration, compared to the circuit 100 in FIG. 1, the transistor Q1 has merely one collector C1 coupled to the reference voltage terminal VSS through the resistor R2, and the transistor Q2 has a first collector C21 coupled to the base B1 of the transistor Q1 and the resistor R1, and a second collector C22 coupled to the reference voltage terminal through the resistive load 220. Explained in a different way, the transistor Q2 has two collectors C21 and C22, and the transistor Q1 has one collector C1. Similar to the circuit 100, the transistors Q1 and Q2 operate as a silicon controlled rectifier (SCR).

For illustration of operation with respect to the circuit 200 in FIG. 2, when a trigger source (not shown) is generated to turn on the transistor Q2, minority carriers are injected from the base-emitter (B2-E2) junction of the transistor Q2. The minority carriers are discharged through the first collector C21 of the transistor Q2 and the resistor R1 to the reference voltage terminal VDD, and also through the second collector C22 of the transistor Q2 and the resistive load 220 to the reference voltage terminal VDD. When the minority carriers are discharged through the first collector C21 and the second collector C22 of the transistor Q2, a current IC1 and a current IC2 are generated accordingly. With the current IC1 flowing through the resistor R1, a voltage at the base B1 of the transistor Q1 is generated. If the base-emitter voltage VBE of the transistor Q1 is sufficient for the transistor Q1 to turn on, the transistor Q1 will be turned on, and thus a silicon controlled rectifier (SCR) including the transistors Q1 and Q2 will be turned on.

In some approaches, minority carriers are mostly discharged through a path including, for example, the first collector C21 of the transistor Q2 as illustrated in FIG. 2. Accordingly, a parasitic SCR in integrated circuits is easily turned on in a way as discussed above. As a result, the integrated circuits including the parasitic SCR can be easily conducted in an undesired condition (also referred to as "latch-up" in some approaches), which leads to the destruction of the integrated circuits in some situations.

Compared to the above approaches, to discharge the minority carriers, a shunt path including, for illustration in FIG. 2, the second collector C22 of the transistor Q2 and the resistive load 220 are provided in the embodiments of the present application. As discussed above, the current IC2 flowing through the shunt path is also generated when the minority carriers are discharged. With the generated current IC2, the current IC1 is reduced compared to related approaches. As a result, the voltage required to turn on the transistor Q1 in FIG. 2 increases. Accordingly, a holding voltage for turning on the SCR which includes the transistors Q1 and Q2 increases as well, and the SCR will not be easily turned on in an undesired condition. As a result, integrated circuits including the SCR will not be conducted in an undesired condition, and will be prevented from being destructed due to undesired operation. Latch-up immunity for the integrated circuits including the SCR is thus improved.

The resistive load 220 and the collectors C21 and C22 of the transistor Q2 in the circuit 200 in FIG. 2 are given for illustrative purposes. Various numbers of resistive loads and collectors of the transistor Q2 in the circuit 200 are within the contemplated scope of the present disclosure.

Figure 3:
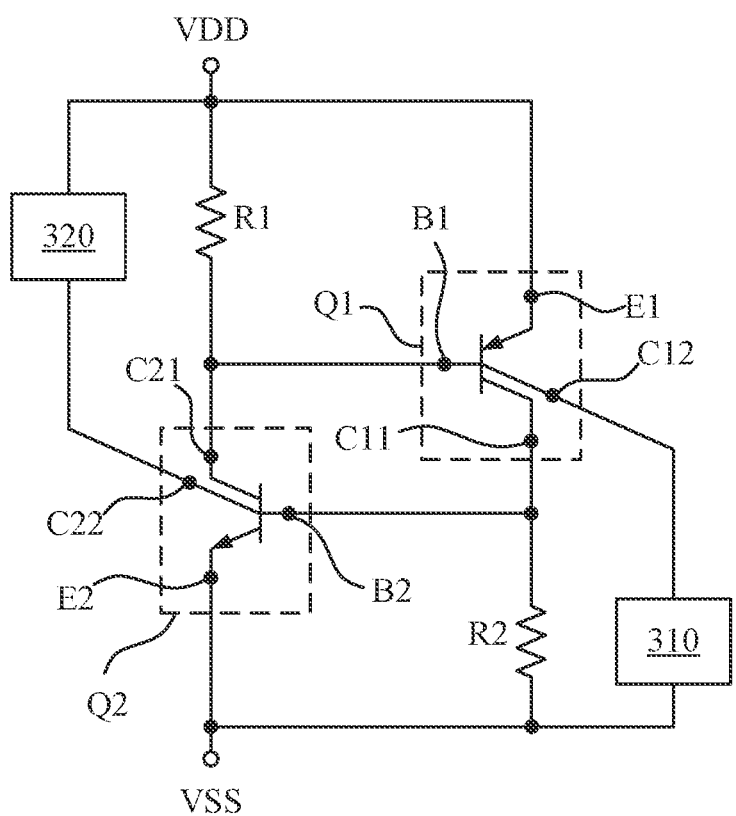
FIG. 3 is a schematic diagram of a circuit in accordance with various embodiments of the present disclosure.

In some alternative embodiments, the transistor Q1 has four terminals, and the transistor Q2 has four terminals. Reference is made to FIG. 3. FIG. 3 is a schematic diagram of a circuit 300 in accordance with various embodiments of the present disclosure. With respect to the embodiments of FIG. 3, like elements in FIG. 1 are designated with the same reference numbers for ease of understanding. The circuit 300 includes transistors Q1 and Q2, the resistors R1 and R2, and two resistive loads 310 and 320. For illustration, compared to the circuit 100 in FIG. 1, the transistor Q2 has a first collector C21 coupled to the base B1 of the transistor Q1 and the resistor R1, and a second collector C22 coupled to the reference voltage terminal through the resistive load 320. Explained in a different way, the transistor Q1 has two collectors C11 and C12, and the transistor Q2 has two collectors C21 and C22. Similar to the circuit 100, the transistors Q1 and Q2 operate as a silicon controlled rectifier (SCR).

Operation with respect to the circuit 300 in FIG. 3 is similar to the circuits 100 and 200 in FIGS. 1 and 2. The minority carriers are discharged through the first collector C11 of the transistor Q1 and the resistor R2 to the reference voltage terminal VSS, and also through the second collector C12 of the transistor Q1 and the resistive load 310 to the reference voltage terminal VSS. Moreover, the minority carriers are discharged through the first collector C21 of the transistor Q2 and the resistor R1 to the reference voltage terminal VDD, and also through the second collector C22 of the transistor Q2 and the resistive load 320 to the reference voltage terminal VDD.

In some approaches, minority carriers are mostly discharged through paths including, for example, the first collector C11 of the transistors Q1 and the first collector C21 of the transistor Q2 as illustrated in FIG. 3. Accordingly, a parasitic SCR in integrated circuits is easily turned on in a way as discussed above. As a result, the integrated circuits including the parasitic SCR can be easily conducted in an undesired condition (also referred to as "latch-up" in some approaches), which leads to the destruction of the integrated circuits in some situations.

Compared to the above approaches, to discharge the minority carriers, two shunt paths including, for illustration in FIG. 3, the second collector C12 of the transistor Q1, the resistive loads 310, the second collector C22 of the transistor Q2 and the resistive loads 320 are provided in the embodiments of the present application. As discussed above, the currents IC2 flowing through the shunt paths are also generated when the minority carriers are discharged. As a result, integrated circuits including the SCR will not be conducted in an undesired condition, and will be prevented from being destructed due to undesired operation. Latch-up immunity for the integrated circuits including the SCR is thus improved.

The resistive loads 310, 320, the collectors C11 and C12 of the transistor Q1, and the collectors C21 and C22 of the transistor Q2 in the circuit 300 in FIG. 3 are given for illustrative purposes. Various numbers of resistive loads and collectors of the transistors Q1 and Q2 in the circuit 300 are within the contemplated scope of the present disclosure.

In some embodiments, resistances of the resistive loads 110, 220, 310 and 320 range from about tens ohm to about 2000 ohm. The resistances of the resistive loads are given for illustrative purposes. Various resistances of the resistive loads 110, 220, 310 and 320 are within the contemplated scope of the present disclosure. For example, in various embodiments, the resistance of each one of the resistive loads 110, 220, 310 and 320 is set such that charges are allowed to be discharged through the corresponding resistive load.

Figure 4:
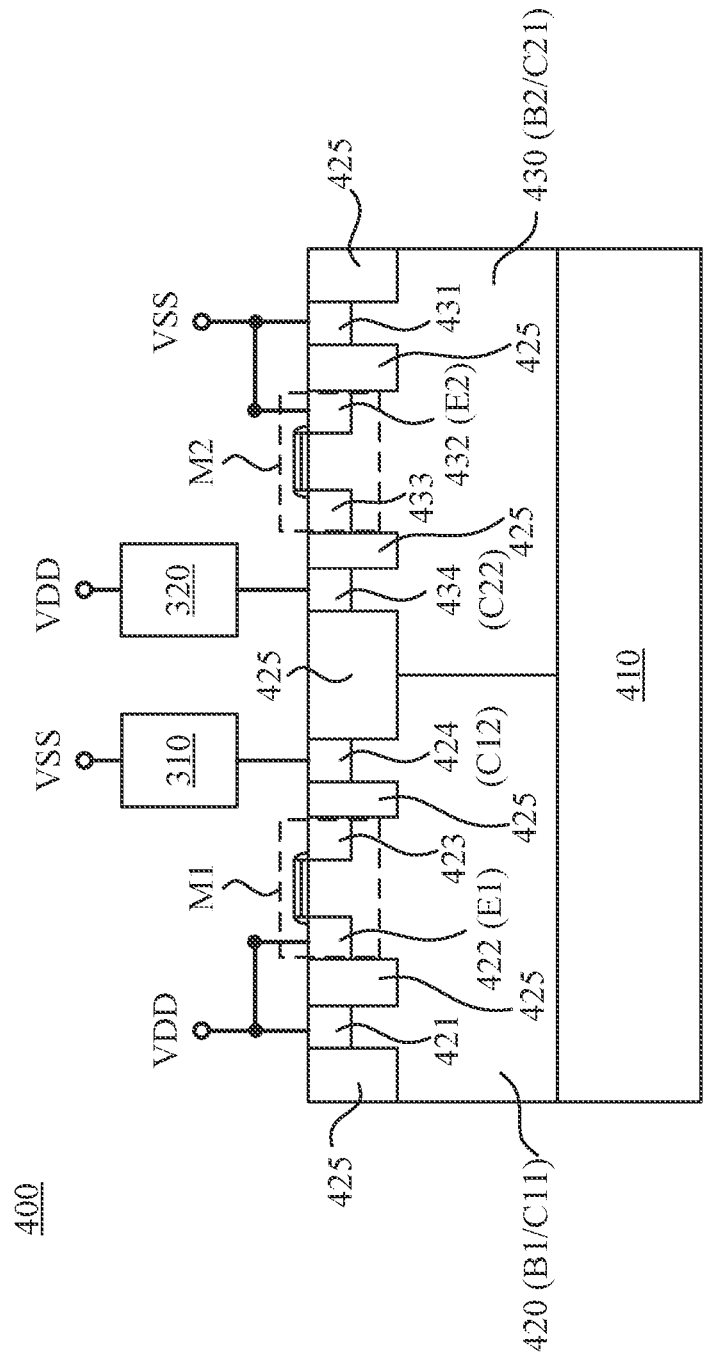
FIG. 4 is a cross-sectional diagram of a semiconductor device of the circuit in FIG. 3, in accordance with some embodiments of the present disclosure.

Reference is made to FIGS. 3 and 4. FIG. 4 is a cross-sectional diagram of a semiconductor device 400 of the circuit 300 in FIG. 3, in accordance with some embodiments of the present disclosure. The semiconductor device 400 includes a substrate 410, a well 420 of a first conductivity type, a well 430 of a second conductivity type, regions 421, 432, 433 and 434 of the first conductivity type, regions 422, 423, 424 and 431 of the second conductivity type, insulators 425, and resistive loads 310 and 320. The region 421 of the first conductivity type and the regions 422, 423 and 424 of the second conductivity type are disposed in the well 420 of the first conductivity type. The region 431 of the second conductivity type and the regions 432, 433 and 434 of the first conductivity type are disposed in the well 430 of the second conductivity type. The resistive load 310 is coupled between the region 424 of the second conductivity type and a reference voltage terminal VSS, and the resistive load 320 is coupled between the region 434 of the first conductivity type and a reference voltage terminal VDD. In some embodiments with reference to FIG. 4, a transistor M1 is formed with respect to the transistor Q1, and a transistor M2 is formed with respect to the transistor Q2. For illustration, the regions 422 and 423 and the well 420 are included in a structure operating as the transistor M1, and the regions 432 and 433 and the well 430 are included in a structure operating as the transistor M2. In some embodiments, each one of the transistors M1 and M2 is a metal oxide semiconductor field effect (MOSFET) transistor.

In some embodiments, the first conductivity type is N-type, the second conductivity type is P-type, and the substrate 410 is a P-type substrate. Accordingly, the regions 421, 432, 433 and 434 are N-type active regions, and the regions 422, 423, 424 and 431 are P-type active regions. The regions 422 and 423 of P-type and the well 420 of N-type are included in a structure operating as a P-type metal oxide semiconductor field effect (MOSFET) transistor M1. The regions 432 and 433 of N-type and the well 430 of P-type are included in a structure operating as an N-type metal oxide semiconductor field effect transistor M2. With reference to FIG. 3 and FIG. 4, the region 422 corresponds to the emitter E of the transistor Q1, the well 420 corresponds to the base B of the transistor Q1, the well 430 corresponds to the collector C1 of the transistor Q1, the region 424 corresponds to the collector C2 of the transistor Q1, the region 432 corresponds to the emitter E of the transistor Q2, the well 430 corresponds to the base B of the transistor Q2, the well 420 corresponds to the collector C1 of the transistor Q2, and the region 434 corresponds to the collector C2 of the transistor Q2. Accordingly, the region 422 of P-type, the well 420 of N-type and the well 430 of P-type form the transistor Q1 in FIG. 3. Similarly, the well 420 of N-type, the well 430 of P-type and the region 432 of P-type form the transistor Q2 in FIG. 3. As above mentioned, the transistors Q1 and Q2 operate as a silicon controlled rectifier (SCR). Explained in a different way, the well 420 of N-type, the well 430 of P-type and the region 432 of N-type that form a parasitic PNPN structure operate as the silicon controlled rectifier (SCR). The resistor R1 has resistance of the well 420, and the resistor R2 has resistance of the substrate 410. As a result, minority carriers in the well 420 are discharged through a path of the region 424 and the resistive load 310 to the reference voltage VSS, and minority carriers in the well 430 are discharged through a path including the region 434 and the resistive load 320 to the reference voltage terminal VDD. The first conductivity type and the second conductivity type are given for illustrative purposes. Various conductivity types of the first conductivity type and the second conductivity type are within the contemplated scope of the present disclosure. In some embodiments, the first conductivity type is P-type, the second conductivity type is N-type, and the reference voltage terminals VDD and VSS are interchanged.

Figure 5:
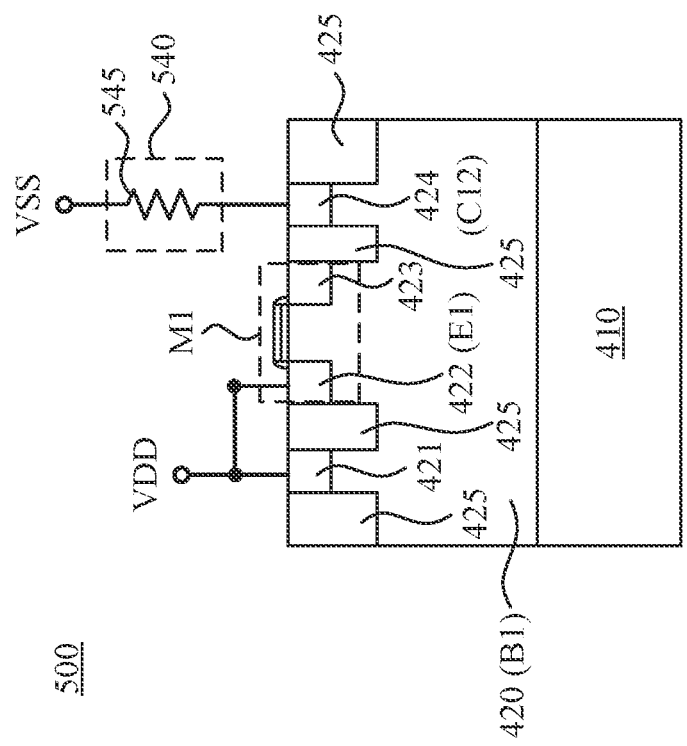
FIG. 5 is a cross-sectional diagram of a portion of the semiconductor device in FIG. 4, together with a resistive load, in accordance with some embodiments of the present disclosure.

In some embodiments, at least one of the resistive loads 110, 220, 310 and 320 includes a metal line pattern or metal routing. In some embodiments, the metal line pattern indicates a pattern in a layout, which is implemented as the resistive load 110, 220, 310, 320, or the combination. In some embodiments, the metal routing indicates a metal interconnection, which is implemented as the resistive load 110, 220, 310, 320, or the combination. Reference is made to FIG. 5. FIG. 5 is a cross-sectional diagram of a portion of the semiconductor device 400 in FIG. 4, together with a resistive load 540, in accordance with some embodiments of the present disclosure. With reference to FIG. 3 and FIG. 5, the region 422 corresponds to the emitter E1 of the transistor Q1, the well 420 corresponds to the base B1 of the transistor Q1, and the region 424 corresponds to the collector C12 of the transistor Q1. With respect to the embodiments of FIG. 5, like elements in FIG. 4 are designated with the same reference numbers for ease of understanding.

In some embodiments, the resistive load 540 coupled between the region 424 and the reference voltage terminal VSS includes a metal line pattern 545 (or metal routing in various embodiments), and the metal line pattern 545 has a resistance. As discussed above, for illustration, the region 421 is an N-type active region, and the regions 422, 423 and 424 are P-type active regions. The regions 422 and 423 of P-type and the well of N-type are included in a structure operating as an P-type metal oxide semiconductor field effect (MOSFET) transistor M1. The minority carriers in the well 420 are discharged through a path of the region 424 and the metal line pattern 545 to the reference voltage VSS. Explained in a different way, the minority carriers in the base B1 of the transistor Q1 in FIG. 3 are discharged through the path of the region 424 and the metal line pattern 545 to the reference voltage VSS. As a result, layout area for preventing latch-up is effectively saved compared to the aforementioned approaches, such as a guard ring structure or a pick-up structure.

In alternative embodiments, compared to FIG. 5, the metal line pattern 545 is coupled between the region 424 and the reference voltage terminal VDD (not shown in FIG. 5). For illustration, the first conductivity type is P-type, the second conductivity type is N-type, and the substrate 410 is P-type, and the regions 421 and 422 are coupled to the reference voltage terminal VSS (not shown FIG. 5). The minority carriers in the well 420 are discharged through a path of the region 424 and the metal line pattern 545 to the reference voltage VDD (not shown in FIG. 5). Explained in a different way, the minority carriers in the base B2 of the transistor Q2 in FIG. 2 are discharged through the path of the region 424 and the metal line pattern 545 to the reference voltage VDD.

Figure 6:
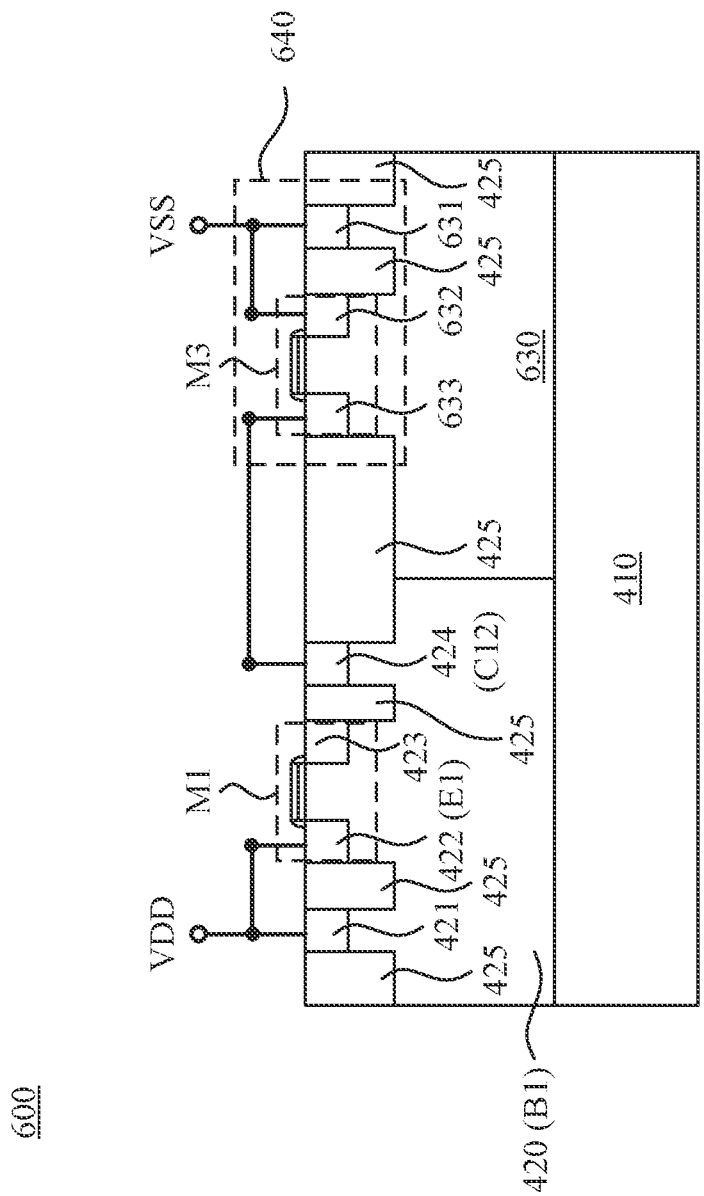
FIG. 6 is a cross-sectional diagram of a portion of the semiconductor device in FIG. 4, together with a resistive load, in accordance with some other embodiments of the present disclosure.

In some embodiments, the resistive load 110, 220, 310, 320 or the combination thereof includes a transistor to be turned on. Reference is made to FIG. 6. FIG. 6 is a cross-sectional diagram of a portion of the semiconductor device 400 in FIG. 4, together with a resistive load 640, in accordance with some embodiments of the present disclosure. With respect to the embodiments of FIG. 6, like elements in FIG. 4 are designated with the same reference numbers for ease of understanding.

Compared to the semiconductor device 500 in FIG. 5, the semiconductor device 600 further includes a well 630 and regions 631, 632 and 633. The regions 631, 632 and 633 are disposed in the well 630. For illustration, the resistive load 640 is coupled between the region 424 and the reference voltage terminal VSS, the first conductivity type is N-type, the second conductivity type is P-type, and the substrate 410 is P-type. The regions 421, 632 and 633 are N-type active regions, and the regions 422, 423, 424 and 631 are P-type active regions. The regions 422 and 423 of P-type and the well 420 of N-type are included in a structure operating as an P-type metal oxide semiconductor field effect (MOSFET) transistor M1. The regions 632 and 633 of N-type and the well 630 of P-type are included in a structure operating as an N-type metal oxide semiconductor field effect (MOSFET) transistor M3 to be turned on. The region 633 of N-type in the transistor M3 is coupled to the region 424 of P-type, and the region 632 of N-type in the transistor M3 is coupled to the reference voltage terminal VSS. As a result, the minority carriers in the well 420 are discharged through a path of the region 424 and the transistor M3 to the reference voltage VSS. Explained in a different way, the minority carriers in the base B1 of the transistor Q1 in FIG. 1 are discharged through the path of the region 424 and the transistor M3 to the reference voltage VSS. As a result, layout area for preventing latch-up is effectively saved compared to the aforementioned approaches, such as a guard ring structure or a pick-up structure.

In alternative embodiments, compared to FIG. 6, the resistive load 640 is coupled between the region 424 and the reference voltage terminal VDD (not shown in FIG. 6). For illustration, the first conductivity type is P-type, the second conductivity type is N-type, the substrate 410 is P-type, and the regions 421 and 422 are coupled to the reference voltage terminal VSS (not shown in FIG. 6). The minority carriers in the well 420 are discharged through a path of the region 424 and the transistor M3 to the reference voltage VDD (not shown in FIG. 6). Explained in a different way, the minority carriers in the base B2 of the transistor Q2 in FIG. 2 are discharged through the path of the region 424 and the transistor M3 to the reference voltage VDD.

Figure 7:
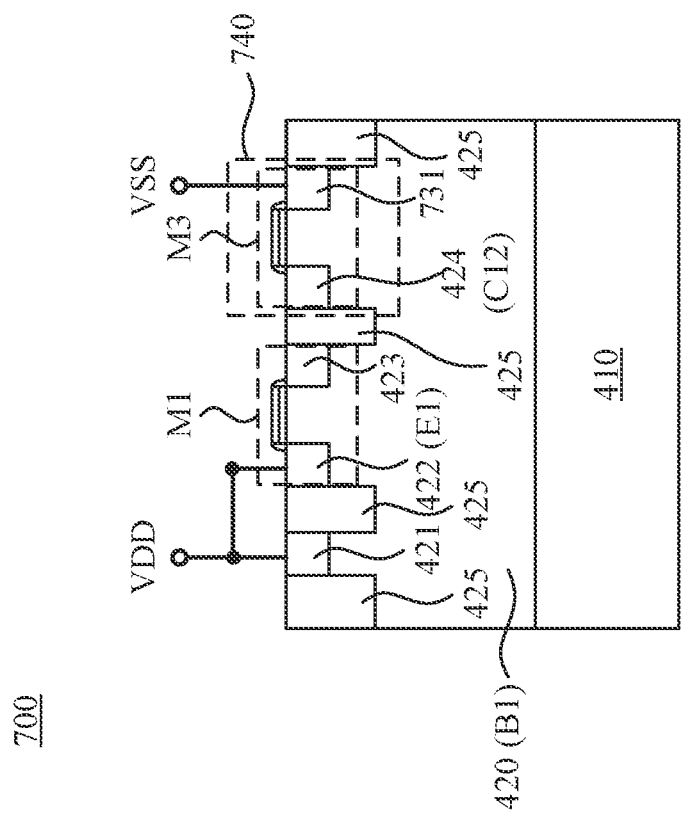
FIG. 7 is a cross-sectional diagram of a portion of the semiconductor device in FIG. 4, together with a resistive load, in accordance with alternative embodiments of the present disclosure.

Reference is made to FIG. 7. FIG. 7 is a cross-sectional diagram of a portion of the semiconductor device 400 in FIG. 4, together with a resistive load 740, in accordance with some embodiments of the present disclosure. With respect to the embodiments of FIG. 7, like elements in FIG. 4 are designated with the same reference numbers for ease of understanding.

Compared to the semiconductor device 500 in FIG. 5, the semiconductor device 700 further includes a region 731 disposed in the well 420. For illustration, the resistive load 740 coupled to the reference voltage terminal VSS, the first conductivity type is N-type, the second conductivity type is P-type, and the substrate 410 is P-type. The region 421 is an N-type active region, and the regions 422, 423, 424 and 731 are P-type active regions. The regions 422 and 423 of P-type and the well 420 of N-type are included in a structure operating as an P-type metal oxide semiconductor field effect (MOSFET) transistor M1. The region 424 and 731 of P-type and the well 420 of N-type are included in a structure operating as a P-type metal oxide semiconductor field effect (MOSFET) transistor M3 to be turned on. The region 731 of P-type in the transistor M3 is coupled to the reference voltage terminal VSS. As a result, the minority carriers in the well 420 are discharged through a path of the transistor M3 to the reference voltage VSS. Explained in a different way, the minority carriers in the base B1 of the transistor Q1 in FIG. 1 are discharged through the path of the transistor M3 to the reference voltage VSS. As a result, layout area for preventing latch-up is effectively saved compared to the aforementioned approaches, such as a guard ring structure or a pick-up structure.

In alternative embodiments, compared to FIG. 7, the resistive load 740 is coupled to the reference voltage terminal VDD (not shown in FIG. 7). For illustration, the first conductivity type is P-type, the second conductivity type is N-type, the substrate 410 is P-type, and the regions 421 and 422 are coupled to the reference voltage terminal VSS (not shown in FIG. 7). The minority carriers in the well 420 are discharged through a path of the transistor M3 to the reference voltage VDD (not shown in FIG. 7). Explained in a different way, the minority carriers in the base B2 of the transistor Q2 in FIG. 2 are discharged through the path of the transistor M3 to the reference voltage VDD.

Figure 8:
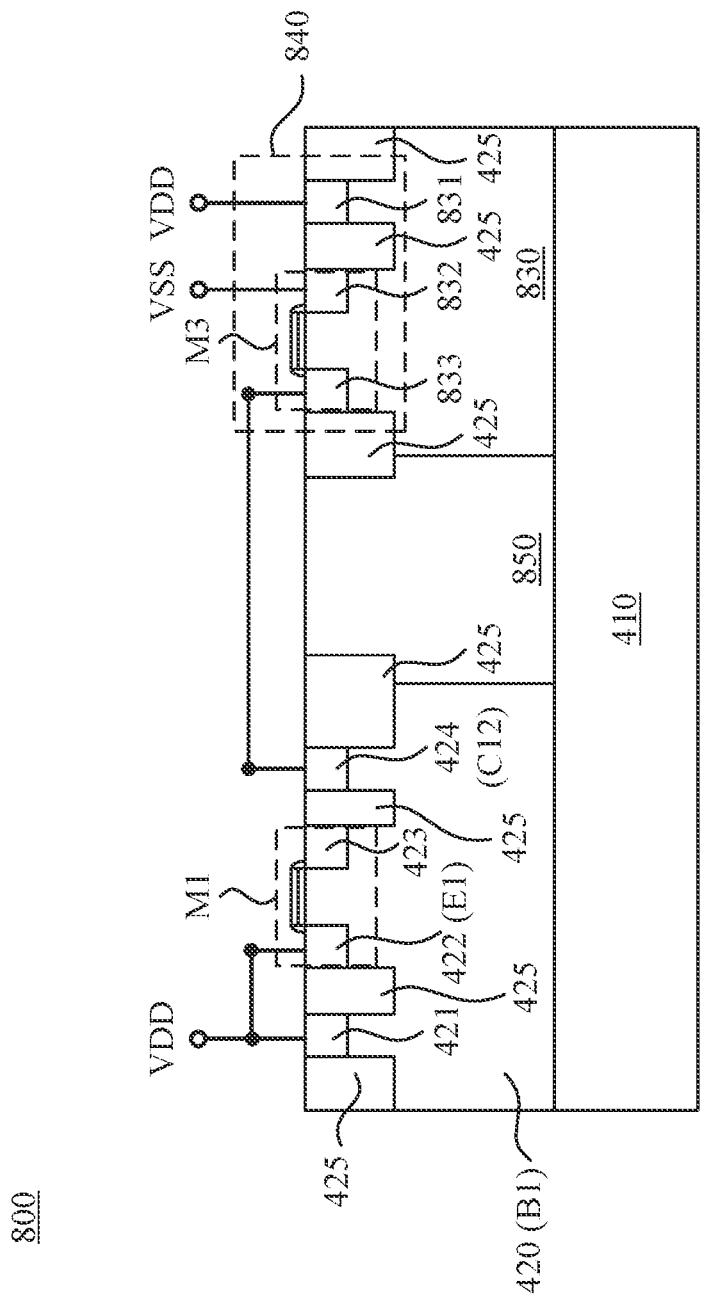
FIG. 8 is a cross-sectional diagram of a portion of the semiconductor device in FIG. 4, together with a resistive load, in accordance with various embodiments of the present disclosure.

Reference is made to FIG. 8. FIG. 8 is a cross-sectional diagram of a portion of the semiconductor device 400 in FIG. 4, together with a resistive load 840, in accordance with some embodiments of the present disclosure. With respect to the embodiments of FIG. 8, like elements in FIG. 4 are designated with the same reference numbers for ease of understanding.

Compared to the semiconductor device 500 in FIG. 5, the semiconductor device 800 further includes wells 830 and 850, and regions 831, 832 and 833. The regions 831, 832 and 833 are disposed in the well 830, and the well 850 is disposed between the wells 420 and 830. For illustration, the resistive load 840 is coupled between the region 424 and the reference voltage terminal VSS, the first conductivity type is N-type, the second conductivity type is P-type, the well 830 is N-type, the well 850 is P-type, and the substrate 410 is P-type. The regions 421 and 831 are N-type active regions, and the regions 422, 423, 424, 832 and 833 are P-type active regions. The regions 422 and 423 of P-type and the well 420 of N-type are included in a structure operating as an P-type metal oxide semiconductor field effect (MOSFET) transistor M1. The regions 832 and 833 of P-type and the well 830 of N-type are included in a structure operating as an P-type metal oxide semiconductor field effect (MOSFET) transistor M3 to be turned on. The region 833 of P-type in the transistor M3 is coupled to the region 424 of P-type, and the region 832 of P-type in the transistor M3 is coupled to the reference voltage terminal VSS. As a result, the minority carriers in the well 420 are discharged through a path of the region 424 and the transistor M3 to the reference voltage VSS. Explained in a different way, the minority carriers in the base B1 of the transistor Q1 in FIG. 1 are discharged through the path of the region 424 and the transistor M3 to the reference voltage VSS. As a result, layout area for preventing latch-up is effectively saved compared to the aforementioned approaches, such as a guard ring structure or a pick-up structure.

In alternative embodiments, compared to FIG. 8, the resistive load 840 is coupled between the region 424 and the reference voltage terminal VDD (not shown in FIG. 8). For illustration, the first conductivity type is P-type, the second conductivity type is N-type, the well 830 is P-type, the well 850 is N-type, the substrate 410 is P-type, and the regions 421 and 422 are coupled to the reference voltage terminal VSS (not shown in FIG. 8). The minority carriers in the well 420 are discharged through a path of the region 424 and the transistor M3 to the reference voltage VDD (not shown in FIG. 8). Explained in a different way, the minority carriers in the base B of the transistor Q2 in FIG. 2 are discharged through the path of the region 424 and the transistor M3 to the reference voltage VDD.

Figure 9:
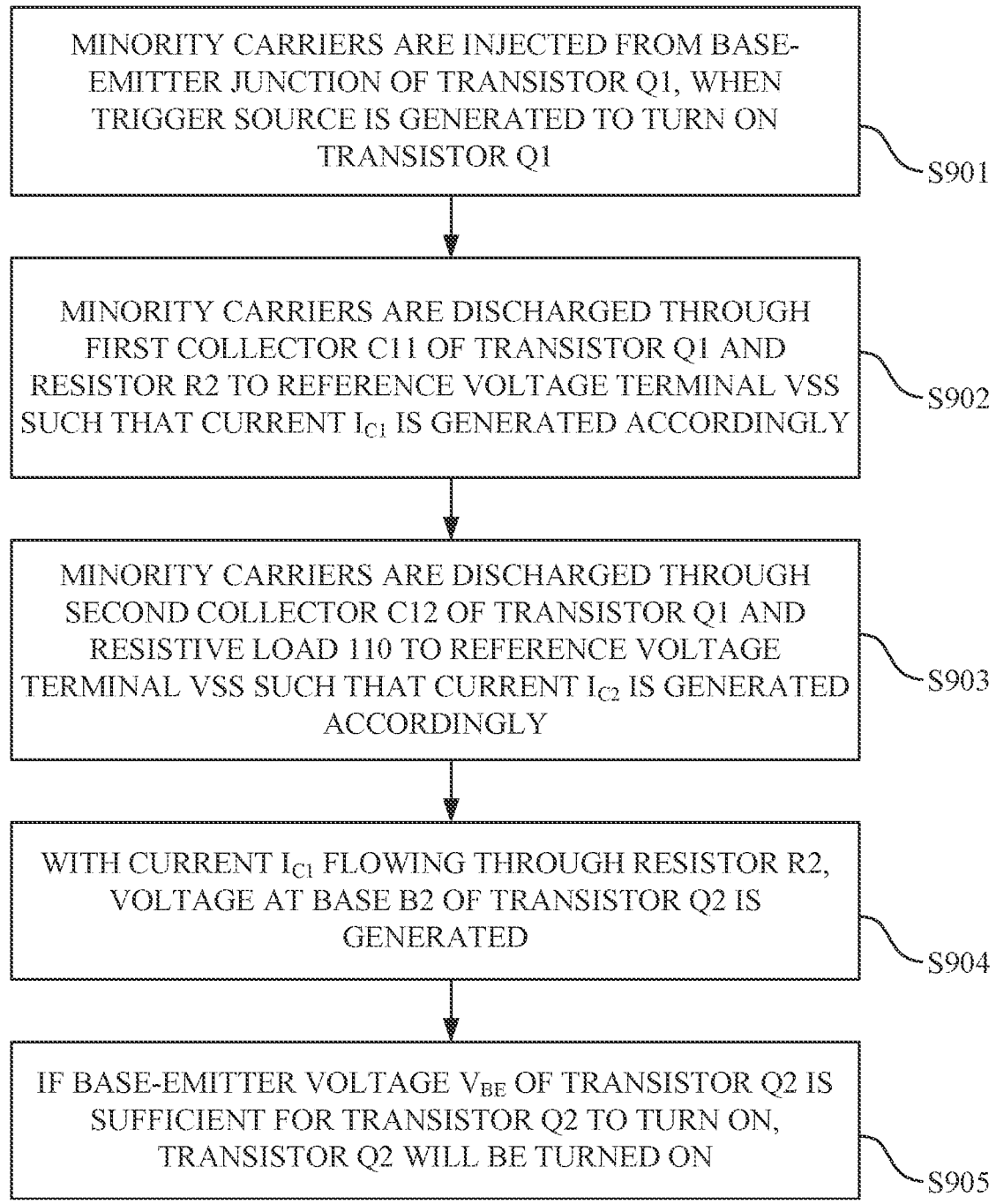
FIG. 9 is a flow chart illustrating a method applied to the circuits illustrated in FIGS. 1-3 or the semiconductor devices illustrated in FIGS. 4-8, in accordance with various embodiments of the present disclosure.

Reference is made to FIG. 9. FIG. 9 is a flow chart illustrating a method 900 applied to the circuits 100, 200 and 300 illustrated in FIGS. 1-3 or the semiconductor devices 400, 500, 600, 700 and 800 illustrated in FIGS. 4-8, in accordance with various embodiments of the present disclosure. For simplicity, the method 900 in FIG. 9 is discussed below with reference to the circuit 100 in FIG. 1. The method 900 includes operations S901, S902, S903, S904 and S905. These operations are given for illustrative purposes. Additional operations are within the contemplated scoped of the present disclosure. For example, in various embodiments, additional operations are provided before, during, and/or after the operations in the method 900, and/or some of the operations described are replaced or eliminated for other embodiments of the method 900.

With reference to the method 900 in FIG. 9 and FIG. 1, in operation S901, minority carriers are injected from the base-emitter (B-E) junction of the transistor Q1, when a trigger source (not shown) is generated to turn on the transistor Q1.

With reference to the method 900 in FIG. 9 and FIG. 1, in operation S902, the minority carriers are discharged through the first collector C1 of the transistor Q1 and the resistor R2 to the reference voltage terminal VSS such that the current IC1 is generated accordingly.

With reference to the method 900 in FIG. 9 and FIG. 1, in operation S903, the minority carriers are discharged through the second collector C2 of the transistor Q1 and the resistive load 110 to the reference voltage terminal VSS such that the current IC2 is generated accordingly.

The sequence of operation S902 and operation S903 illustrated in FIG. 9 are only given for illustrative purposes. Various sequences of operation S902 and operation S903 are within the contemplated scope of the present disclosure. For example, operation S902 and operation S903 are effectively performed at the same time in various embodiments.

With reference to the method 900 in FIG. 9 and FIG. 1, in operation S904, with the current IC1 flowing through the resistor R2, a voltage at the base B of the transistor Q2 is generated.

With reference to the method 900 in FIG. 9 and FIG. 1, in operation S905, if the base-emitter voltage VBE of the transistor Q2 is sufficient for the transistor Q2 to turn on, the transistor Q2 will be turned on. Accordingly, a silicon controlled rectifier (SCR) including the transistors Q1 and Q2 will be turned on to operate.

For simplicity, the method 900 corresponding to the circuit 100 in FIG. 1 is discussed above. Methods corresponding to the circuits 200 and 300 in FIGS. 2 and 3 include operations corresponding to those in the method 900 in FIG. 9, and thus they are not detailed herein.

While the methods provided herein are illustrated and described above as a series of acts or events, it will be appreciated that the illustrated ordering of such acts or events are not to be interpreted in a limiting sense. The operations are not necessarily performed in the order described. For example, some acts occur in different orders and/or concurrently with other acts or events apart from those illustrated and/or described herein. In addition, not all illustrated acts may be required to implement one or more aspects or embodiments of the description herein. Further, in some embodiments, one or more of the acts depicted herein is carried out in one or more separate acts and/or phases. Alternatively stated, the order of the operations disclosed in the present disclosure are able to be changed, or the operations are able to be executed simultaneously or partially simultaneously as appropriate, in accordance with the spirit and scope of various embodiments of the present disclosure.

Based on the above embodiments, the minority carriers in the base of the transistor Q1 and/or the transistor Q2 are discharged through at least one shunt path of the resistive load 110 and/or the resistive load 220 to the reference voltage VSS and/or the reference voltage terminal VDD in the present disclosure. Therefore, the base-emitter voltage VBE of the transistor Q1 and/or the base-emitter voltage VBE of the transistor Q2 required for turning on the silicon controlled rectifier (SCR) are increased. Compared to the aforementioned approaches, latch-up immunity is effectively improved and the layout area is saved in the present disclosure.

Also disclosed is a semiconductor device. The semiconductor device includes a first region, a second region, a third region, a fourth region, a fifth region, a first resistive load and a second resistive load. The first region is configured to operate as a first terminal of a first transistor, and coupled to a first reference voltage terminal. The second region is configured to operate as a second terminal of the first transistor. The third region is included in a first structure operating as the first transistor. The fourth region is configured to operate as a first terminal of a second transistor, and coupled to a second reference voltage terminal. The fifth region is configured to operate as a second terminal of the second transistor. The first resistive load is configured to couple the second region to the second reference voltage terminal. The second resistive load is configured to couple the fifth region to the first reference voltage terminal. The first region, the third region, the second region, the fifth region and the fourth region are arranged in order, each of the first region, the second region and the third region corresponds to a first conductive type, and each of the fourth region and the fifth region corresponds to a second conductive type different from the first conductive type.

Also disclosed is a semiconductor device. The semiconductor device includes a first well, a second well, a third well, a first region, a second region, a third region, a fourth region and a fifth region. The first well, the second well and the third well are arranged in order. The first region is disposed in the first well and coupled to a first reference voltage terminal. The second region is disposed in the first well and coupled to the first reference voltage terminal. The third region is disposed in the third well and coupled to the first reference voltage terminal. The fourth region is disposed in the third well. The fifth region is disposed in the first well and coupled to the fourth region. Each of the first well, the third well, the second region, and the third region corresponds to a first conductive type, and each of the second well, the first region, the fourth region, and the fifth region corresponds to a second conductive type different from the first conductive type.

Also disclosed is a method. The method includes: discharging charges from a first reference voltage terminal to a second reference voltage terminal through a first well, a first region disposed in the first well and a second region disposed in the first well; and discharging charges from the first reference voltage terminal to the second reference voltage terminal through the first well, a third region disposed in the first well and separated from the second region, a fourth region disposed in a second well and the second well in order. Each of the first well, the first region and the second well corresponds to a first conductive type, each of the second region, the third region and the fourth region corresponds to a second conductive type different from the first conductive type, the third region is separated from the second region, and the first well is separated from the second well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
  a first region configured to operate as a first terminal of a first transistor, and coupled to a first reference voltage terminal;
  a second region configured to operate as a second terminal of the first transistor;
  a third region included in a first structure operating as the first transistor;
  a fourth region configured to operate as a first terminal of a second transistor, and coupled to a second reference voltage terminal;
  a fifth region configured to operate as a second terminal of the second transistor;
  a first resistive load configured to couple the second region to the second reference voltage terminal; and
  a second resistive load configured to couple the fifth region to the first reference voltage terminal,
  wherein the first region, the third region, the second region, the fifth region and the fourth region are arranged in order,
  each of the first region, the second region and the third region corresponds to a first conductive type, and
  each of the fourth region and the fifth region corresponds to a second conductive type different from the first conductive type.

2. The semiconductor device of claim 1, further comprising:
  a sixth region included in a second structure operating as the second transistor, disposed between the fourth region and the fifth region, and corresponding to the second conductive type.

3. The semiconductor device of claim 1, further comprising:
  a sixth region coupled to the fourth region and the second reference voltage terminal, and corresponding to the first conductive type,
  wherein the fourth region is disposed between the sixth region and the fifth region.

4. The semiconductor device of claim 3, further comprising:
  an insulator disposed between and adjacent to the sixth region and the fourth region, to separate the sixth region and the fourth region from each other.

5. The semiconductor device of claim 1, further comprising:
  a sixth region coupled to the first region and the first reference voltage terminal, and corresponding to the second conductive type,
  wherein the first region is disposed between the sixth region and the third region.

6. The semiconductor device of claim 1, further comprising:
a well corresponding to the second conductive type,
wherein the first resistive load comprises a sixth region disposed in the well, and corresponding to the first conductive type, and
each of the first region, the second region, the third region, and the fourth region is disposed in the well.

7. The semiconductor device of claim 1, further comprising:
a first well corresponding to the second conductive type; and
a second well separated from the first well, and corresponding to the second conductive type,
wherein the first resistive load comprises a sixth region disposed in the second well, coupled to the first reference voltage terminal, and corresponding to the second conductive type, and
each of the first region, the second region, the third region, and the fourth region is disposed in the first well.

8. The semiconductor device of claim 7, wherein the first resistive load further comprises:
a seventh region disposed in the second well, coupled to the second region, and corresponding to the first conductive type; and
an eighth region disposed in the second well, disposed between the seventh region and the sixth region, coupled to the second reference voltage terminal, and corresponding to the first conductive type.

9. A semiconductor device, comprising:
a first well, a second well and a third well arranged in order;
a first region disposed in the first well and coupled to a first reference voltage terminal;
a second region disposed in the first well and coupled to the first reference voltage terminal;
a third region disposed in the third well and coupled to the first reference voltage terminal;
a fourth region disposed in the third well;
a fifth region disposed in the first well and coupled to the fourth region; and
an insulator disposed between the fourth region and the fifth region,
wherein each of the first well, the third well, the second region, and the third region corresponds to a first conductive type, and
each of the second well, the first region, the fourth region, and the fifth region corresponds to a second conductive type different from the first conductive type.

10. The semiconductor device of claim 9, further comprising:
a fourth well adjacent to the first well; and
a sixth region disposed in the fourth well, and coupled to the first reference voltage terminal through a resistive load.

11. The semiconductor device of claim 9, further comprising:
a sixth region disposed in the third well, disposed between the third region and the fifth region, and coupled to a second reference voltage terminal different from the first reference voltage terminal.

12. The semiconductor device of claim 11, further comprising:
a fourth well adjacent to the first well; and
a seventh region disposed in the fourth well, and coupled to the second reference voltage terminal,
wherein each of the fourth well and the seventh region corresponds to the first conductive type.

13. The semiconductor device of claim 12, further comprising:
an eighth region disposed in the fourth well, coupled to the second reference voltage terminal, and corresponding to the second conductive type.

14. The semiconductor device of claim 13, further comprising:
a ninth region disposed in the fourth well, disposed between the eighth region and the fifth region, coupled to the first reference voltage terminal through a resistive load, and corresponding to the second conductive type.

15. The semiconductor device of claim 14, further comprising:
a tenth region disposed in the fourth well, disposed between the eighth region and the ninth region, and corresponding to the second conductive type,
wherein the tenth region and the eighth region are included in a structure operating as a transistor.

16. A method, comprising:
discharging charges from a first reference voltage terminal to a second reference voltage terminal through a first well, a first region disposed in the first well and a second region disposed in the first well; and
discharging charges from the first reference voltage terminal to the second reference voltage terminal through the first well, a third region disposed in the first well and separated from the second region, a fourth region disposed in a second well and the second well in order,
wherein each of the first well, the first region and the second well corresponds to a first conductive type,
each of the second region, the third region and the fourth region corresponds to a second conductive type different from the first conductive type,
the third region is separated from the second region, and
the first well is separated from the second well.

17. The method of claim 16, further comprising:
discharging charges from the second reference voltage terminal to the first reference voltage terminal through a third well adjacent to the first well, a fifth region disposed in the third well and a sixth region disposed in the third well,
wherein the fifth region and the sixth region are separated from each other.

18. The method of claim 17, further comprising:
discharging charges from the second reference voltage terminal to the first reference voltage terminal through the third well and a seventh region disposed in the third well in order,
wherein each of the sixth region and the seventh region corresponds to the first conductive type, and
each of the fifth region and the third well corresponds to the second conductive type.

19. The method of claim 16, further comprising:
discharging charges from the first reference voltage terminal to the second reference voltage terminal through the second well and a sixth region disposed in the second well in order.

20. The method of claim 19, further comprising:
coupling the first reference voltage terminal to a seventh region disposed in the second well,
wherein the sixth region is disposed between the seventh region and the fourth region, and
the seventh region corresponds to the first conductive type.

* * * * *